United States Patent [19]

Shirasaka

[11] 4,312,067

[45] Jan. 19, 1982

[54] FUNCTION TEST EVALUATION APPARATUS FOR EVALUATING A FUNCTION TEST OF A LOGIC CIRCUIT

[75] Inventor: Hisatoshi Shirasaka, Tokyo, Japan

[73] Assignee: Tokyo Shibaura Denki Kabushiki Kaisha, Japan

[21] Appl. No.: 98,694

[22] Filed: Nov. 29, 1979

[30] Foreign Application Priority Data

Dec. 23, 1978 [JP] Japan .................. 53-160705

[51] Int. Cl.³ .......................................... G01R 31/28
[52] U.S. Cl. .................... 371/25; 324/73 R
[58] Field of Search ................ 371/25; 324/73 R

[56] References Cited

U.S. PATENT DOCUMENTS

| | | | |
|---|---|---|---|
| 3,673,397 | 6/1972 | Schaefer | 371/25 |
| 3,714,571 | 1/1973 | Walker | 371/25 X |
| 3,761,695 | 9/1973 | Eichelberger | 371/25 |
| 4,194,113 | 3/1980 | Fulks et al. | 371/25 X |

OTHER PUBLICATIONS

Megivern, "Digital Delay Technique", *IBM Tech. Disclosure Bulletin*, vol. 21, No. 7, Dec. 1978, pp. 2794-2795.

*Primary Examiner*—David H. Malzahn
*Attorney, Agent, or Firm*—Finnegan, Henderson, Farabow, Garrett & Dunner

[57] ABSTRACT

The input test information and the expected value information stored in a main memory are stored in first and second local memories through first and second write circuits. The first and second local memories are addressed with given different phases by first and second address control circuits, respectively, so that the first and second local memories produce the information in parallel fashion with given periods. The information outputted are applied to a data multiplexer. Upon the application of the information, the data multiplexer converts the information inputted parallely thereto into the serial information which in turn is applied to the input pattern format control circuit and GO/NO GO judgement circuit. The response information from the integrated circuit to be tested is applied to the GO/NO GO judgement circuit where GO or NO GO of the integrated circuit is judged.

3 Claims, 11 Drawing Figures

| ADDRESS \ PIN NO | IN/OUT | 1 | 1 | 0 | 0 | --- | 1 | 1 | 0 | 0 |
|---|---|---|---|---|---|---|---|---|---|---|
| | | 1 | 2 | 3 | 4 | --- | | | | n |
| 0 | | 0 | 1 | 1 | | ---- | | | | |
| 0' | | 0 | 0 | 0 | | ---- | | | | |
| 1 | | 1 | 1 | 0 | | ---- | | | | |
| 1' | | | | | | | | | | |
| 2 | | | | | | | | | | |
| 2' | | | | | | | | | | |
| N | | | | | | | | | | |
| N' | | | | | | | | | | |

- A MEMORY OUT DATA
- B INPUT CLOCK 1
- C INPUT CLOCK 2
- D NRZ·CLOCK 1
- E RZ·CLOCK 1
- F RZ·CLOCK 2

FUNCTION TEST EVALUATION APPARATUS FOR EVALUATING A FUNCTION TEST OF A LOGIC CIRCUIT

BACKGROUND OF THE INVENTION

The invention relates to a function test evaluation apparatus for evaluating a function test of an integrated circuit in a manner that the test information is supplied to an integrated circuit to be tested and the output information outputted from the integrated circuit is compared with the expected information previously prepared.

A function test evaluation apparatus for judging if the function of a large scale integrated circuit (LSI), such as a one-chip microcomputer, generally needs a memory (hereinafter called a local memory) for storing the expected value information and the input test information to be supplied to an integrated circuit to be tested at the time of the execution of the test, as well known.

FIG. 1 shows a block diagram of a conventional function test evaluation apparatus for evaluating a function test of an integrated circuit. In the figure, a control section 10 is comprised of a central processor (CPU) and a main memory 12. The main memory 12 previously stores the input test information for testing the function of the integrated circuit and the expected information for evaluating the response information from the integrated circuit under test.

A write circuit 13 successively writes the information read out from the main memory 12 into a local memory 14. The input test information and the expected value information, having been written into the main memory 12, are stored in the local memory 14. The data stored in the local memory 14 is successively read out under control of an address control circuit 15 when the test is executed, and the input test information and the expected value information are supplied to an input pattern format control circuit 16 and a GO/NO GO judgement circuit 17.

In the input pattern format control circuit 16, the input test information is selected and, in the GO/NO GO judgement circuit 17, the expected value information is selected. The input test information inputted to the input pattern format control circuit are time-shaped therein, then are converted into necessary voltage levels by a plurality of data drivers $18_1$ to $18_n$, and are finally applied into an integrated circuit 20 to be tested.

Responding to the test information, the integrated circuit 20 produces the response information which in turn are applied in parallel to a set of voltage comparators $19_{a1}$ to $19_{an}$ and $19_{b1}$ to $19_{bn}$. A reference voltage with logical high level is further inputted to the voltage comparators $19_{a1}$ to $19_{an}$ while a reference voltage with logical low level is further applied to the voltage comparators $19_{b1}$ to $19_{bn}$.

Those voltage comparators $19_{a1}$ to $19_{an}$ and $19_{b1}$ and $19_{bn}$ are used to set the voltage level of the voltage produced from the integrated circuit to HIGH level (logical '1') or LOW level (logical '0'). The information after its level is set is then applied to the GO/NO GO judgement circuit 17. The judgement circuit 17 compares the information supplied through the voltage comparators $19_{a1}$ to $19_{an}$ and $19_{b1}$ to $19_{bn}$ with the expected value information and evaluates the function of the integrated circuit 20 on the basis of the result of the comparison.

The operation of the function test evaluation apparatus described above will be described by using the timing charts shown in FIG. 2. Firstly, a timing pulse TP1 shown in FIG. 2A is supplied to the address control circuit 15. Since the control circuit 15 operates in synchronism with the timing pulse TP1, the different address information are successively inputted to the local memory 14 every period T1 of the timing pulse TP1.

After a period T2 shown in FIG. 2, since the local memory 14 is addressed by the address information, the read-out operation of the information previously stored in the local memory 14 is completed. Following the read-out operation, the input pattern format control circuit 16 time-shapes the information read out in synchronism with the input timing pulse TP2 shown in FIG. 2C. Then, the information is supplied through the data drivers $18_1 \ldots 18_n$ to the integrated circuit 20.

The information outputted from the integrated circuit 20 is inputted to the GO/NO GO judgement circuit 17 in synchronism with the timing TP3 where it is compared with the expected value information. Since the information is read out from the local memory 14 every period T1 of the timing pulse TP1, the period T1 is the test period.

In order to effect the function evaluation of LSI, a great number of the input test information and the expected value information are necessary. Therefore, for processing the information for its evaluation for a short time, it is necessary to operate the memory at a high speed and to read out information for a short time. Further, in order to perform the function evaluation in real time, the local memory 14 must be operated at the speed almost equal to that of the integrated circuit 20.

The operation of the local memory 14 at high speed, may be realized by shortening the test period T1. However, it is impossible to make the period T1 shorter than the cycle time T2 of the local memory 14. As a consequence, in order to operate the local memory 14 at high speed, it is necessary to use the local memory with a short cycle time. However, the local memory with short cycle time is expensive, so that the function test evaluation apparatus using such is also expensive.

SUMMARY OF THE INVENTION

Accordingly, an object of the invention is to provide a function test evaluation apparatus for evaluating the function of an integrated circuit for a short time.

In order to achieve the above object, there is provided a function test evaluation apparatus for evaluating the function of a logic circuit comprising: a control section including a main memory for storing the input test information to be supplied to an integrated circuit to be tested and the expected value information to be outputted from the integrated circuit, and a central processing element for performing various controls; a plurality of memory means which stores the input test information supplied from the main memory of the control section and the expected value information, those information being read out through the addressing; a plurality of write circuit means for writing the input test information outputted from the main memory and the expected value information therefrom; a plurality of address control circuit means for successively supplying the address information to the memory means with given phase differences; parallel-to-serial converting means which is supplied in parallel with the information successively read out from the memory means through the designation by the address control circuit means and which produces the information in serial fashion; pattern format control circuit means which time-shapes the test information outputted serially from the parallel to serial converting circuit means and then supplies it to the circuit to be tested; and a judgement circuit for comparing the expected value information outputted serially from the parallel-to-serial converting circuit with the information outputted from the integrated circuit after it is supplied with the input test information.

This invention will be better understood from the following description taken in connection with the accompanying drawings, in which:

DETAILED DESCRIPTION FOR THE PREFERRED EMBODIMENT

Figure 1:
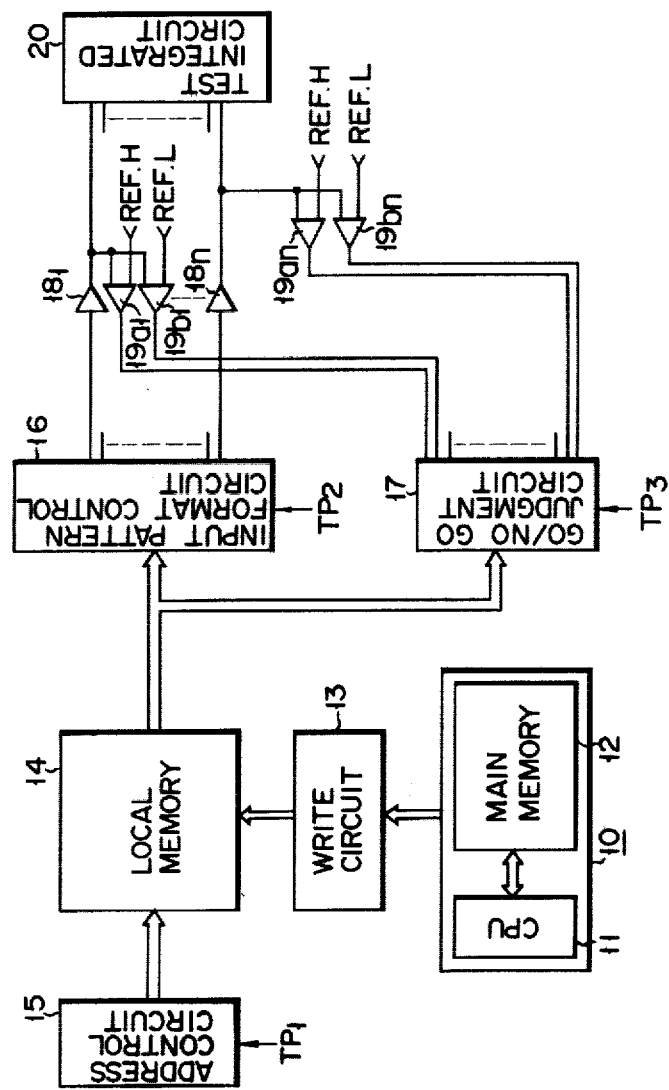
FIG. 1 shows a block diagram of a conventional function test evaluation apparatus for evaluating the function of a logic circuit.
Figure 2:
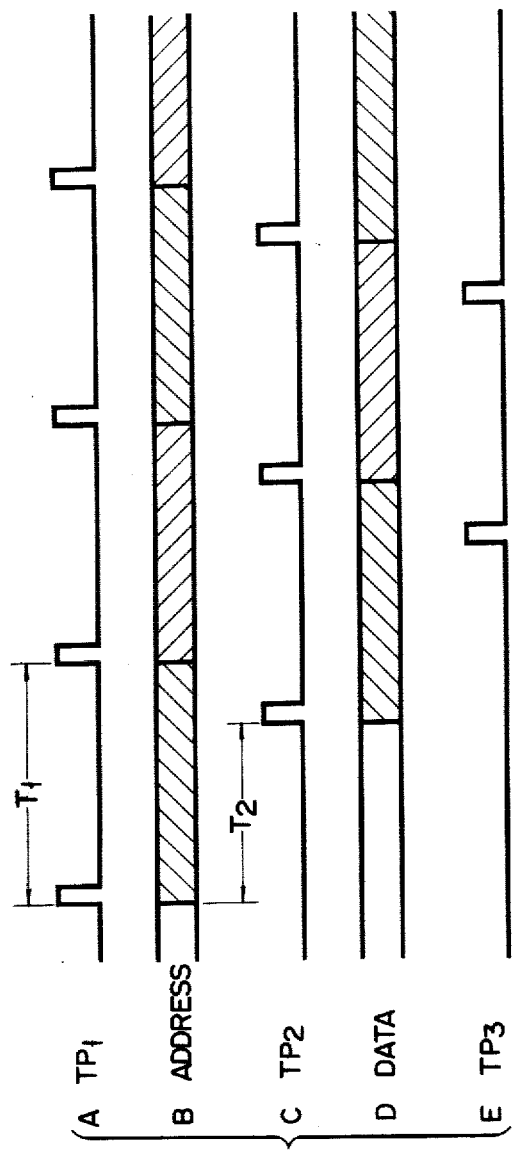
FIG. 2 shows a set of timing charts useful in explaining the operation of the apparatus shown in FIG. 1.
Figure 3:
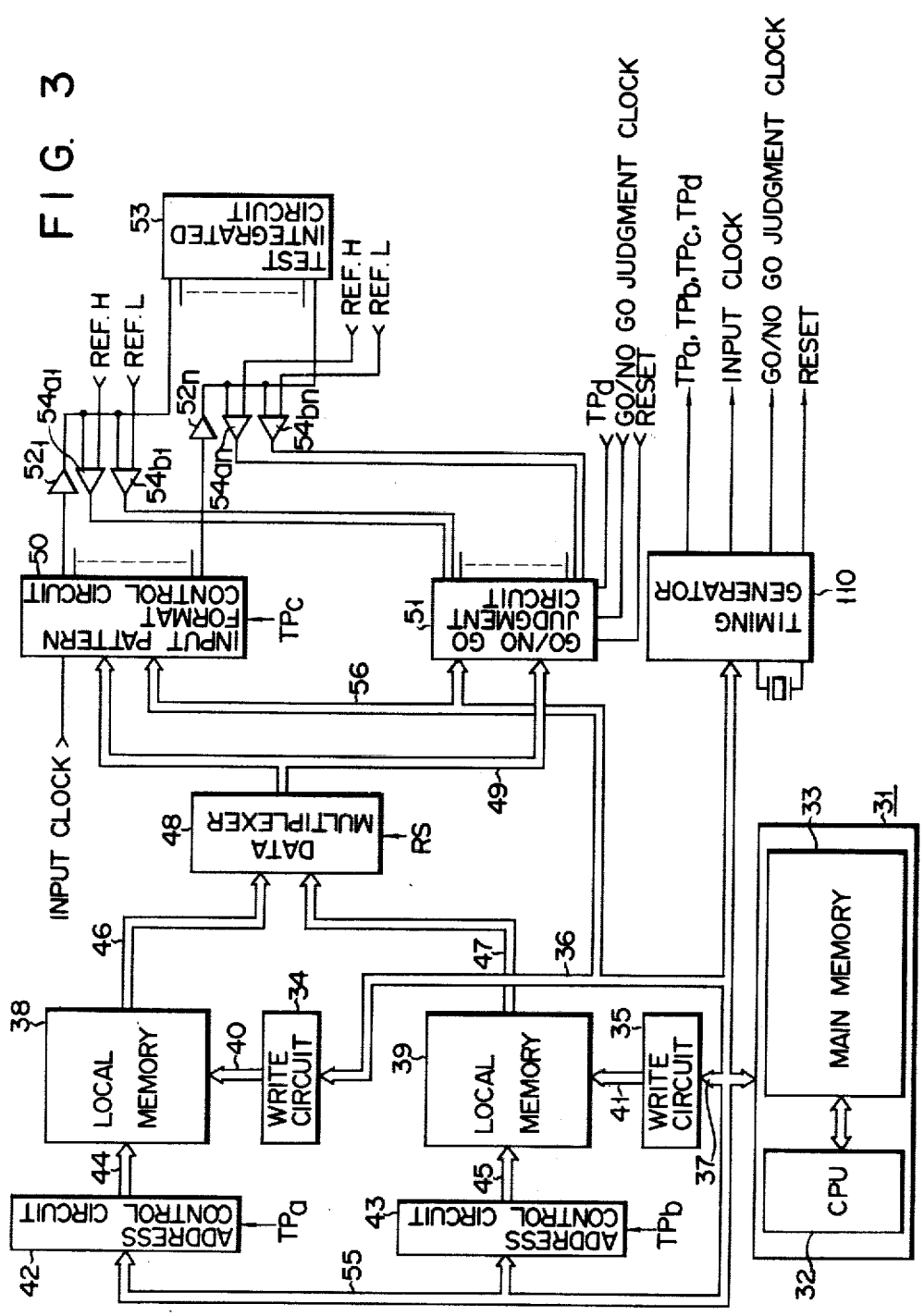
FIG. 3 shows a block diagram of an embodiment of the function test evaluation apparatus according to the invention.

Function Test Evaluation Apparatus (FIG. 3)

FIG. 3 is a block diagram illustrating an embodiment of a function test evaluation apparatus for testing the function of a logical circuit according to the invention.

In the figure, a control section 31 is comprised of a CPU 32 and a main memory 33. As in the conventional apparatus, in the main memory 33 are previously stored the input test information and the expected value information which are required for evaluating the function test of the logical circuit. The control section 31 is connected through data buses 36 and 37 to first and second write circuits 34 and 35. Further, the first and second write circuits 34 and 35 are connected through data buses 40 and 41 to first and second local memories 38 and 39. And those circuits write into the first local memory 38 and the second local memory 39 the input test information and the expected value information read out from the main memory 33.

The first and second address control circuits 42 and 43 are connected through an address bus 55 to the control section 31 and further connected through data buses 44 and 45 to the first and second local memories 38 and 39.

Those circuits also produce address information A in sequence every time timing pulses $TP_a$ and $TP_b$, which differ in phase by half period from each other, are inputted thereto. In other words, the first address control circuit 42 applies the address information to a local memory 38 by the timing pulse $TP_a$. After half period, the timing pulse $TP_b$ is inputted to the second address control circuit 43 which in turn applies the address information B to the second local memory 39. Accordingly, the first local memory 38 and the second local memory 39 are addressed with the pulse difference of half period from each other.

The first and second local memories 38 and 39 are connected to a data multiplexer 48 through data buses 46 and 47. A read select signal RS is inputted to the data multiplexer 48 which in turn selects output information from the first and second local memories 38 and 39 on the basis of a logical value of the signal RS. Specifically, the data multiplexer 48 selects information outputted from the first local memory 38 during the period that the RS signal is in a high level while it selects information outputted from the second local memory 39 during the period that the RS signal is in a low level.

To be more specific, the data multiplexer 48 has a parallel-serial converting function for converting two pieces of information parallelly inputted thereto into serial information.

An output from the data multiplexer 48 through data bus 49 is coupled with an input pattern format control circuit 50 and a GO/NO GO judgement circuit 51. The circuits 50 and 51 are also connected to the control section 31 through a data bus 56. The input pattern format control circuit 50 receives the input test information and the expected value information from the data multiplexer 48. The circuit 50 is connected to receive the input test information and the expected value information. Circuit 50 selects the input test information, adjusts input timing and effects other operations to time-shape and perform other functions.

The input pattern format control circuit 50 also receives an input clock selected information and the information for designating a return zero (RZ) or a non return zero (NRZ) from the control section 31 through a data bus 56. Then the time-shaped information are inputted to a plurality of data drivers $52_1$ to $52_n$. The data drivers $52_1$ to $52_n$ convert a voltage level of the information inputted thereto into a given voltage level. The information converted to a given voltage level is inputted to an integrated circuit 53 to be tested.

After receiving the test information, the integrated circuit 53 produces the response information which in turn are inputted in parallel to pairs of voltage comparators $54_{a1}$ and $54_{b1}$ to $54_{an}$ and $54_{bn}$. The voltage comparators $54_{a1}$ and $54_{b1}$ to $54_{an}$ and $54_{bn}$ set the voltage level of the information produced from the test integrated circuit 53 to a logical "HIGH" level or a logical "LOW" level.

The information, after the voltage level thereof is set, is applied to the judgement circuit 51. The judgement circuit 51 synchronizes the response information and the expected value information applied thereto through the voltage comparators $54_{a1}$ and $54_{b1}$ to $54_{an}$ and $54_{bn}$ with a timing pulse $TP_d$ and compares the response information and the expected value information. Depending upon the result of the comparison, the circuit 51 judges whether the test integrated circuit 53 functions properly.

The control section 31, which is coupled with a timing generator 110 through a data bus, controls the timing generator 110 to produce timing pulses $TP_a$ to $TP_d$, an input clock signal, a clock signal for judgement of the circuit function, and a reset signal which is applied to the address control circuits 42 and 43, the input information circuit 50, and the judgement circuit 51.

Figure 4:
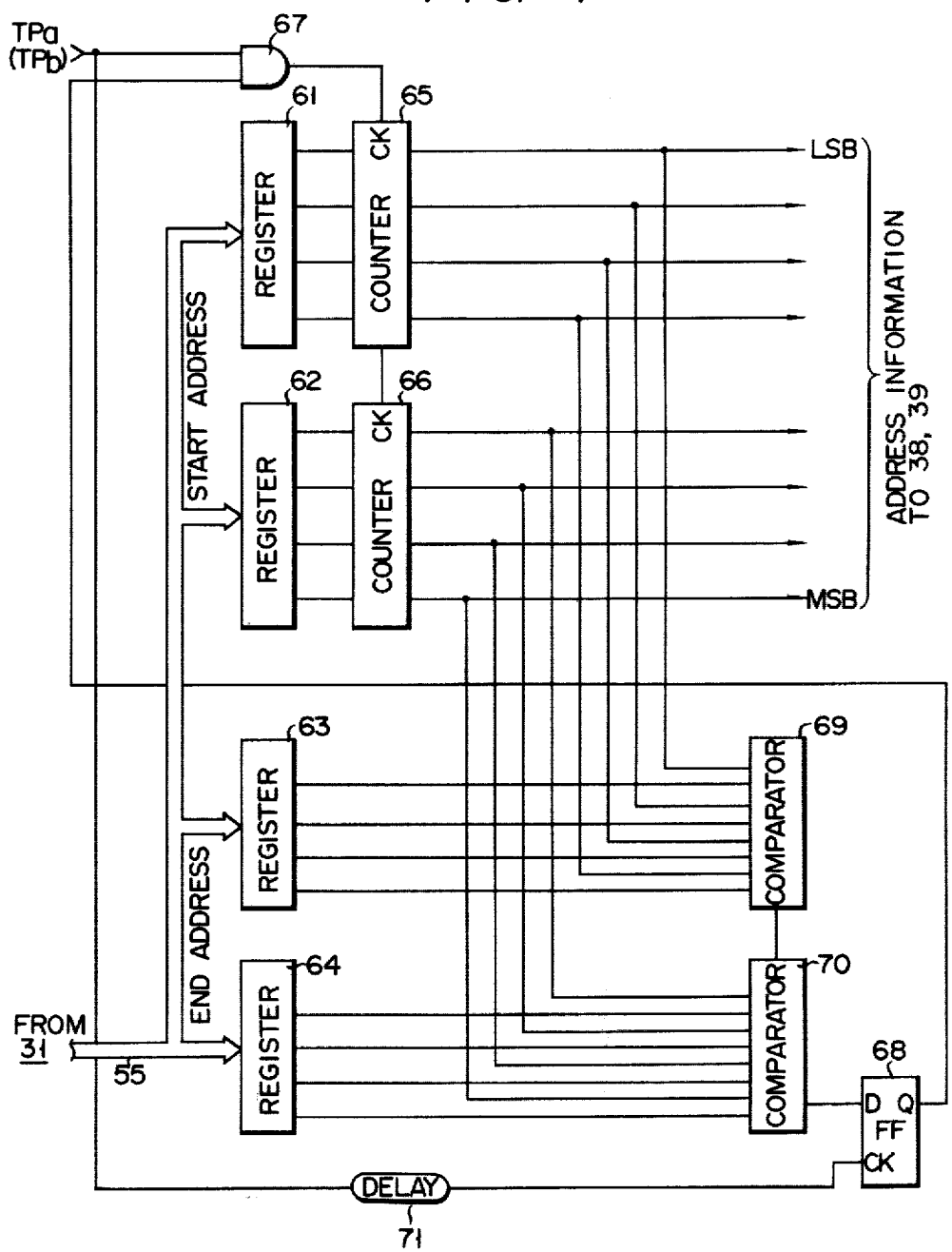
FIG. 4 shows a circuit diagram of an address control circuit used in the circuit shown in FIG. 3.

Address Control Circuit (FIG. 4)

The address control circuit 42 (43) will be described in detail with reference to FIG. 4. Those circuits are the same in the construction and hence one of them will be described. As shown, the address control circuit 42(43) has registers 61 and 62 for temporarily storing a start address and registers 63 and 64 for temporarily storing an end address. That is to say, those registers temporarily store the start address or the end address transferred from through the data bus 55.

In this embodiment, those registers 61 to 64 are each constructed by 4 bits and may be SN74175 (Quad D flip-flop with clear) by Texas Instruments Inc. The output signals from the start address registers 61 and 62 are applied to 4-bit counters 65 and 66, respectively.

The counters 65 and 66 receive the output signal from an AND circuit 67 as a clock signal and increment the address value by 1 every time the clock signal is applied thereto. The timing pulse TPa (TPb) and a Q output signal from the flip-flop circuit 68 to be described later are applied to the AND circuit 67. When both the signals are logical '1', the AND circuit 67 is fully conditioned to apply the clock signal to the counters 65 and 66.

The address information outputted from the counters 65 and 66 is applied to comparators 69 and 70. The end address information loaded in the end address registers 63 and 64 is also applied to the comparators 69 and 70. The comparators 69 and 70, which are comprised of exclusive OR circuits, for example, compare the address information incremented from the counters 65 and 66 with the end address information, respectively. When those information are not coincident with each other, the comparators 69 and 70 produce signals of logical '1', and when those information are coincident with each other, the comparators produce signals of logical '0'.

Those signals outputted from the comparators 69 and 70 are inputted to a D type flip-flop 68 and are latched. To the D type flip-flop 68, the timing pulse $TP_a(TP_b)$ is also inputted as a clock signal through a delay line 71. In response to the clock signal, the D flip-flop 68 produces the latched information to the AND circuit 67.

In the comparators 69 and 70, when the counted address value (current address) and the end value are coincident with each other, the comparators 69 and 70 produce signals of logical '0' which in turn are applied through the D type flip-flop 68 to one of the input terminals of the AND gate 67. Subsequently, the AND circuit 67 applies logical '0' to the counters 65 and 66, so that the address control circuits 42 and 43 cease their operations.

Figure 5:
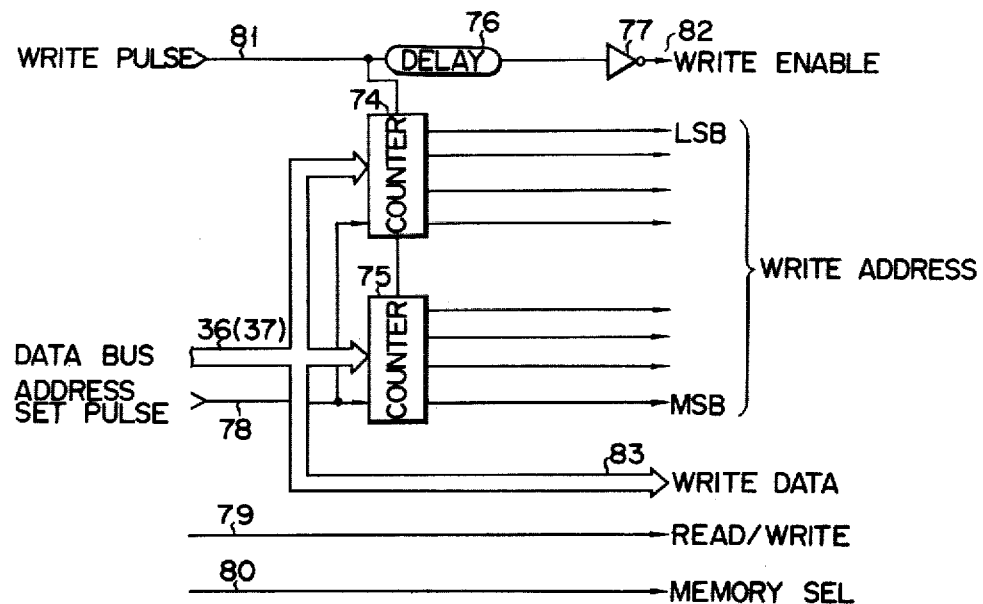
FIG. 5 shows a circuit diagram of a write circuit used in the circuit shown in FIG. 3.

Write Circuit (FIG. 5)

The write circuit 34 (35) will be described with reference to FIG. 5. As shown, the write circuit 34 (35) has the counters 74 and 75 each of 4 bits. To those counters 74 and 75 is applied the address information from the control section 31 through the data bus 36 (37).

At the timing of the address set pulse, the address information is loaded into the counters 74 and 75. A write pulse is supplied to the counters 74 and 75 and, at the timing of the write pulse, the counters 74 and 75 produce the counts as the write address information to the local memory 38 (39).

In addition to the address set pulse, the main control section 31 produces a read/write signal, a memory select signal, and a write pulse signal. The write pulse is applied to the local memory 38 (39) through a delay line 76 and an inverter 77, as a write enable signal 82. After a write start address is set in the 4-bit counters 74 and 75 by the data bus 36 (37) and an address set pulse 78, the counters 74 and 75 operate in response to a write pulse 81 in synchronism with write data 83 to supply the write address to the local memory 38 (39).

The read/write signal designates a read mode or write mode of the local memory 38 (39). The memory select signal 80 selects a local memory to be used for data write from those memories.

Figure 6:
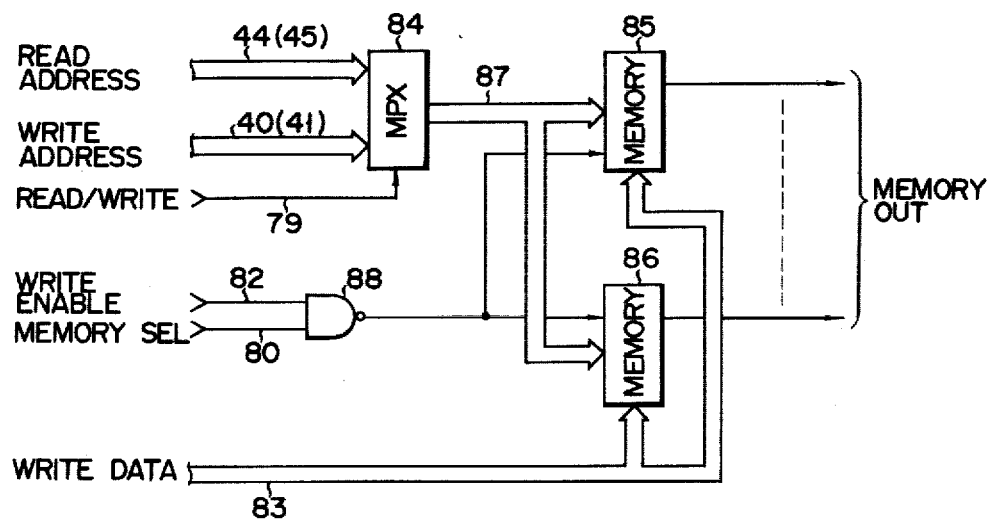
FIG. 6 shows a circuit diagram of a local memory used in the circuit shown in FIG. 3.

Local Memory (FIG. 6)

Explanation will be made in detail of the local memory 38 (39) taken in connection with FIG. 6.

In the figure, the local memory 38 (39) has a multiplexer 84 to which read address information and write address information are applied through data buses 44 (45) and 40 (41). SN4157, manufactured by Texas Instrument Inc., for example, may be used for the multiplexer 84.

The read/write signal 79 is also applied to the multiplexer 84. In response to the read/write signal, the multiplexer 84 applies read or write address to memories 85 and 86 through a bus 87.

The memory 85 or 86 may be I2147 by Intel Corp., for example. The write enable signal 82 and the memory select signal 80 are applied through a NAND circuit 88 to the memories 85 and 86, respectively. Further, write data 83 is applied to the memories 85 and 86. In a read mode, data from the memories 85 and 86 are applied to the input pattern format control circuit 50 and the judgement circuit 51.

Figures 7, 10:
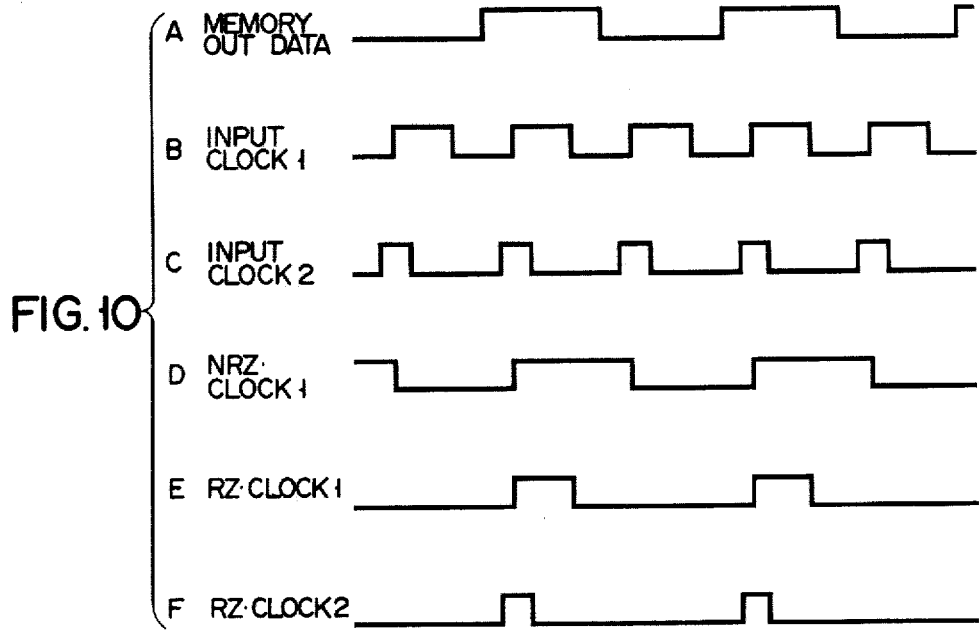
FIG. 7 shows a memory map of the local memory shown in FIG. 6.
FIG. 10 shows a set of wave forms of the output signals outputted from the input pattern format control circuit shown in FIG. 9.

A memory map of the local memory 38 or 39 is as shown in FIG. 7. The pins of the integrated circuit to be tested are numbered 1 to n. Those numbers are further specified with input (I) or output (O) pins, as shown. An address 0 stores a bit pattern (0, 1, 1, . . . ) and an address 0' stores a bit pattern (0, 0, 0, . . . ).

Figure 8:
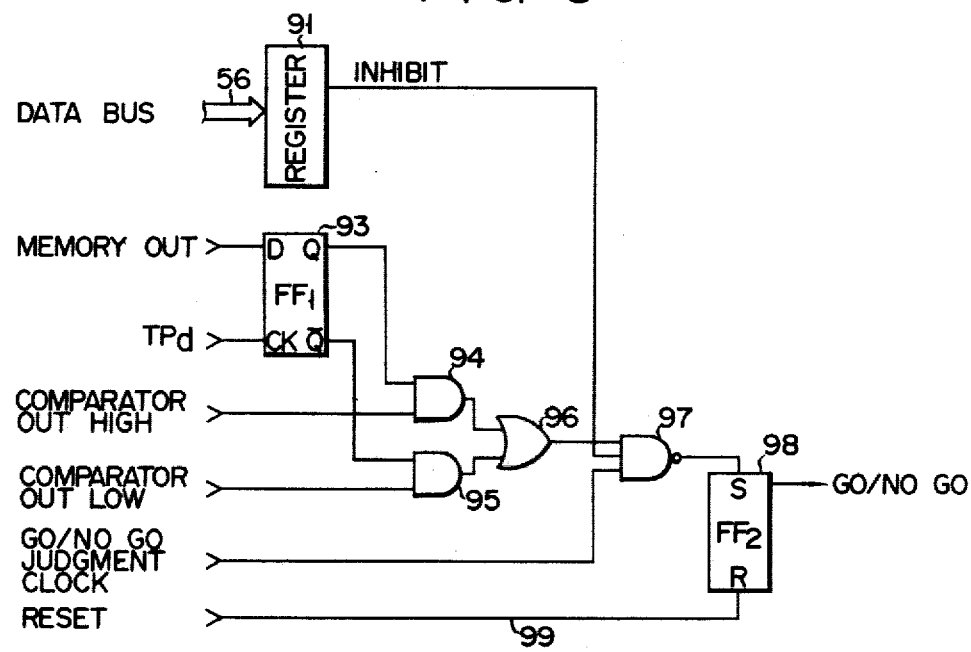
FIG. 8 shows a circuit diagram of a GO/NO GO judgement circuit used in the circuit shown in FIG. 3.

Judgement Circuit (FIG. 8)

The judgement circuit 51 will be described with reference to FIG. 8.

In the figure, the judgement circuit 51 has a register 91 to which judgement inhibit information from the control section 31 is applied through the data bus 56 (one bit of the related information passing through the data bus 56 is used for this inhibit information).

The judgement circuit 51 corresponds to the pin 1 of the integrated circuit 53. For example, if the integrated circuit 53 has sixty pins, sixty judgement circuits, each as shown in FIG. 8, are used. The judgement circuit 51 selects only the input test information and the expected value information transferred from the data multiplexer 48, and it does not react to the pin bearing the inhibit information.

Output information from the data multiplexer 48 is latched in a D type flip-flop 93. The D-type flip-flop 93 applies the output Q and the output $\overline{Q}$ to one of the input terminals of each of AND circuits 94 and 95 in synchronism with a timing pulse.

Output signals with HIGH level from the comparators $54_{a1}$ to $54_{an}$ shown in FIG. 3 are applied to the other input terminal of the AND circuit 94. The other input terminal of the AND circuit 95 is supplied with output signals with LOW level from the comparators 54$_{bl}$ to 54$_{bn}$. The output signals from the AND circuits 94 and 95 are applied to the first input of three inputs of a NAND circuit 97 through an OR circuit 96. The NAND circuit 97 receives at the second input terminal the output information from the register and at the third input the clock signal for GO/NO GO judgement.

By the bit pattern, '1' or '0' of the expected value information is selected either of HIGH or LOW level of the output signal from the comparator. When the result of the judgement is NO GO, the flip-flop 98 is set at the timing of the judgement clock. The output signal GO/NO GO of the flip-flop 98 is transferred to the control section 31 and then a display section (not shown) displays 'GO' or 'NO GO'. The flip-flop 98 is reset by the reset signal 99.

Figure 9:
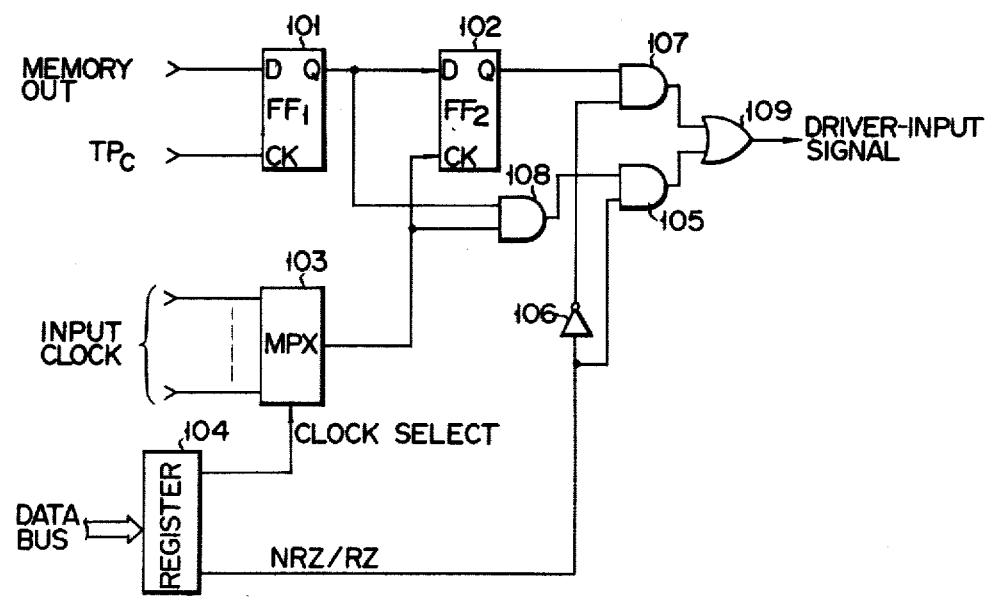
FIG. 9 shows a circuit diagram of an input pattern format control circuit used in the same circuit.

Input Pattern Format Control Circuit (FIG. 9)

The input pattern format control circuit 50 will be described with reference to FIG. 9.

As shown, the input pattern format control circuit 50 includes a flip-flop 101 in which the output information from the data multiplexer 48, or the input test information, is latched at the timing of the timing pulse TPc. The Q output of the flip-flop 101 is coupled with the input terminal of a second flip-flop circuit 102 and the output information of the multiplexer 103 is applied to the clock terminal of the flip-flop 102. The multiplexer 103, which has received various clock signals to time-shape the input test information, is so constructed as to select one of the measuring pins.

The selection of the input clock signal is made by a clock selection signal applied from a register 104 to the multiplexer 103. The various control information, for example, the information for designating the non-return-to-zero (NRZ) information or the return-to-zero information, comes through the data bus 56 from the control section 31 and is loaded into the register 104 via the data bus. The output information of the register 104 is inputted to one of the input terminals of an AND circuit 105 and to one of the input terminals of an AND circuit 107 by way of an inverter 106. The Q output of the flip-flop 102 is applied to the other input of the AND circuit 107. The Q output of the flip-flop 101 is applied through an AND circuit 108 to the other input of the AND circuit 105. The output of the AND circuits 107 and 105 are applied to the respective input of an OR circuit 109. The output signal from the OR circuit 109 is applied as a data drive signal to data registers 52$_1$ to 52$_n$.

The wave-form of the output signal from the input pattern format control circuit 50 is illustrated in FIG. 10, for example. FIG. 10A shows a waveform of a signal inputted to the D type flip-flop 101. The wave-forms shown in FIGS. 10B and 10C are examples of various input clock signals applied to the multiplexer 103. FIG. 10D shows a wave-form of an output signal from the OR circuit 109 when an input clock signal 1 is selected in the NRZ method. FIG. 10E shows a wave-form obtained when the input clock signal 1 is selected in the RZ method. A wave-form shown in FIG. 10F is obtained when an input clock signal 2 (CLOCK 2) is selected in the RZ method.

Operation

Figure 11:
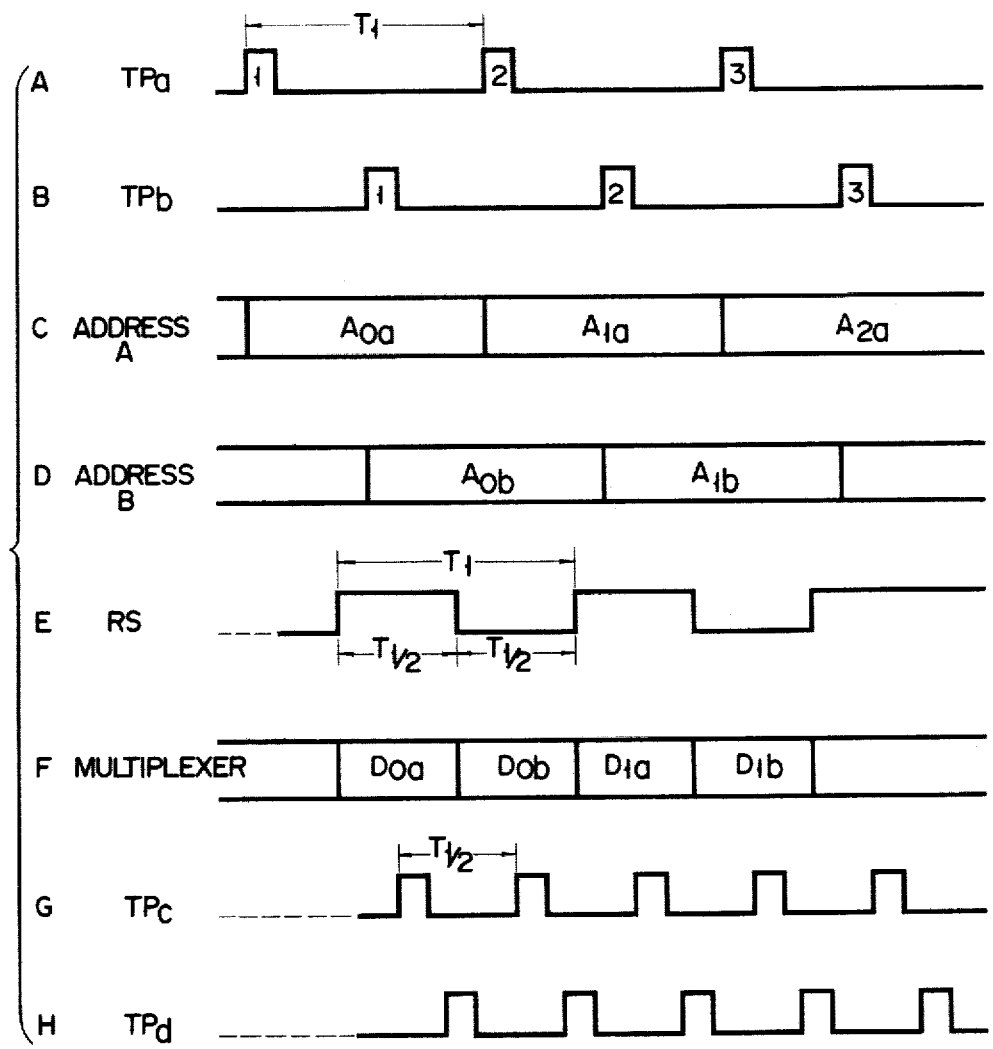
FIG. 11 shows a set of timing charts useful in explaining the operation of the embodiment shown in FIG. 3.

The operation of the function test evaluation apparatus thus constructed will be described with reference to FIG. 11.

Firstly, the input test information and the expected value information previously stored in the main memory 33 are read out and are stored into the first and second local memories 38 and 39 under control of the first write circuit 34 and the second write circuit 35. Then, timing pulses TPa and TPb, which have a fixed period T$_1$ but are different in phase by half period, as shown in FIG. 11A, are successively applied to the first address control circuit 42 and the second address control circuit 43.

After the 1st timing pulse TPa is applied to the first address control circuit 42, the circuit 42 produces address information AO$_a$ to make an access to the 0th address of the first local memory 38, as shown in FIG. 11C. It is held until the next timing pulse TP$_a$ is inputted thereto.

After T$_\frac{1}{2}$ since the first timing pulse is inputted to the address control circuit 42, the first timing pulse TP$_b$ is inputted to the second address control circuit 43. As a result, the second address control circuit 43 produces address information AO$_b$ to make an access to the 0th address of the second local memory as shown in FIG. 11D and it is held until the next timing pulse TP$_b$ comes in.

Upon receipt of the address information Ao$_a$, the first local memory 38 produces information Do$_a$ stored in the address 0 while, upon receipt of the address information AO$_b$, the second local memory 39 produces the information DO$_b$ stored in the address 0.

After the information DO$_a$ is read out from the first local memory 38, the read select signal RS rises as shown in FIG. 11E and then is in a HIGH level state during the period of T$_\frac{1}{2}$. During a period that the signal RS is in HIGH level state, the data multiplexer 48 selects the information DO$_a$ outputted from the first local memory 38 and produces the selected one.

After the period of T$_\frac{1}{2}$ the read select signal falls to be LOW level and then sustains its LOW level for the T$_\frac{1}{2}$ period, as shown in FIG. 11E. At a time point that the read select signal RS falls to be LOW level, the information DO$_b$ has been read out from the second local memory 39. Therefore, during a period that the read select signal RS is in LOW level, the data multiplexer 48 selects the information DO$_b$ outputted from the record local memory 39 and produces the selected one.

Accordingly, upon receipt of the first timing pulses TP$_a$ and TP$_b$, the data multiplexer 48 sequentially produces the information DO$_a$ and DO$_b$ stored in the 0th addresses of the first and second local memories 38 and 39, as shown in FIG. 11F.

As shown in FIG. 11G, a timing pulse TP$_c$ with the same period as the period T$_\frac{1}{2}$ for which the information is produced from the data multiplexer 48, as shown in FIG. 11G is inputted to the input pattern format control circuit. The input pattern format control circuit 50 time-shapes the input test information and produces it for transfer to a plurality of data drivers 52$_1$ to 52$_n$.

The data drivers 52$_1$ to 52$_n$ convert the voltage level of the information inputted into a given voltage level and supplies the converted information to the integrated circuit 53 to be tested. Subsequently, every time the subsequent timing pulses TP$_a$ and TP$_b$ are inputted with T$_\frac{1}{2}$ phase differences, the first and the second control circuits 42 and 43 produce the address information $A_{1a}$, $A_{1b}$, $A_{2a}$, $A_{2b}$, ... for accessing to the address 1, address 2, ..., and the multiplexer 48 continuously produces the information $D_{1a}$, $D_{1b}$, $D_{2a}$, $D_{2b}$, ... with $T_{178}$ periods, as shown in FIG. 11F.

The input test information and the expected value information are randomly contained in the information outputted from the data multiplexer 48. If the information contained is the test information, it is inputted to the integrated circuit 53 through the data drivers $52_1$, ..., $52_n$. If it is expected value information, it is inputted to the GO/NO GO judgement circuit 51.

The integrated circuit 53 responds to the input test information to produce response information. The response information is applied to one of the input terminals of each of the voltage comparators $54_{al}$, $54_{bl}$, ... $54_{an}$, $54_{bn}$.

A reference signal with HIGH level '1' is applied to the other input terminal of each of the voltage comparators $54_{al}$, ... $54_{an}$. A reference signal with LOW ('0') level is applied to the other input terminals of the voltage comparators $54_{bl}$ to $54_{bn}$.

Accordingly, the voltage comparators $54_{al}$ to $54_{an}$ and $54_{bl}$ to $54_{bn}$ compare the response information thereto with the reference signals to set the response information to HIGH or LOW level of the signal. The output signals from the voltage comparators are inputted to the GO/NO GO circuit 51. Upon receipt of the timing pulse $TP_d$ shown in FIG. 11H, the judgement circuit 51 compares the response information with the expected information. The circuit 51 evaluates the function of the integrated circuit 53 to finally judge if the function is GO or NO GO.

In the function test evaluation circuit according to the invention, the period in the time period $T_{\frac{1}{2}}$, or the test period, when the test information is applied from the data drivers $52_1$ to $52_n$ to the integrated circuit 53 and it corresponds to $\frac{1}{2}$ of the period $T_1$ of the timing pulses $TP_a$ and $TP_b$. Therefore, when the memories with the same cycle time as the conventional cycle time are used for the local memories 38 and 39, the test period is half the conventional test period, so that the function test of the integrated circuit may be performed for a short time.

In other words, when the function test is conducted with the same test period as the conventional period, the cycle times of each of the local memories 38 and 39 may be about twice the conventional memory cycle time. Generally, in the memories with same memory capacities but different cycle times, the memory with longer cycle time is cheaper than that with the shorter one. In this respect, the function test evaluation apparatus is advantageous.

In the above-mentioned embodiment, two local memories are used; however, the number of the local memories is not limited to such. For example, if the number of the local memories is further increased, it is possible that, in accordance with the cycle time of the memory used, a cheaper local memory is used or the function of the integrated circuit is evaluated for a short time.

What is claimed is:

1. An apparatus for evaluating the proper functioning of a logic circuit comprising:
   a control section including a central processing element for performing control functions and a main memory in data communication with said control processing element for storing test information and expected value information, said test information to be inputted to said logic circuit being evaluated and said expected value information to be compared to data outputted from said logic circuit to determine whether said logic circuit is operating properly;
   a plurality of memory means for storing said input test information and the expected value information from said main memory;
   a plurality of write circuits connected between said control section and said plurality of memory means for writing the test information from said main memory into said plurality of memory means;
   a plurality of address circuits connected between said control system and said plurality of memory means for supplying addresses to said memory means;
   a pattern format control circuit for time-shaping test information received from said plurality of memory means and for sending said time-shaped test information to said logic circuit being evaluated; and
   a judgement circuit for comparing data outputted from said logic circuit being evaluated with the expected value information to determine if said logic circuit is operating properly, said expected value information being received by said judgement circuit from said plurality of memory means.

2. The test apparatus in claim 1 further including parallel-to-serial converting means for taking said information from said memory means in a parallel format and converting said information into a serial format to be supplied to said pattern format control circuit.

3. The test apparatus in claim 2 further including a timing generator whose outputs are connected to said judgement circuit, to said pattern format control circuit, and to said parallel-to-serial converting means for providing synchronization for said apparatus and for use in time-shaping said test information.

* * * * *